(12) United States Patent
Gray et al.

(10) Patent No.: US 8,302,062 B2
(45) Date of Patent: Oct. 30, 2012

(54) METHODS TO OBTAIN A FEASIBLE INTEGER SOLUTION IN A HIERARCHICAL CIRCUIT LAYOUT OPTIMIZATION

(75) Inventors: Michael S. Gray, Fairfax, VT (US); Xiaoping Tang, Mohegan Lake, NY (US); Xin Yuan, Roseville, CA (US)

(73) Assignee: International Business Machines Corporation, Armonk, NY (US)

( * ) Notice: Subject to any disclaimer, the term of this patent is extended or adjusted under 35 U.S.C. 154(b) by 248 days.

(21) Appl. No.: 12/712,880

(22) Filed: Feb. 25, 2010

(65) Prior Publication Data

US 2010/0153892 A1   Jun. 17, 2010

Related U.S. Application Data

(63) Continuation-in-part of application No. 11/782,706, filed on Jul. 25, 2007, now Pat. No. 7,761,818.

(51) Int. Cl.
*G06F 17/50* (2006.01)
(52) U.S. Cl. ......... 716/132; 716/124; 716/135; 716/139
(58) Field of Classification Search .................. None
See application file for complete search history.

(56) References Cited

U.S. PATENT DOCUMENTS

| | | | |
|---|---|---|---|
| 5,475,842 A | 12/1995 | Gilbert et al. | |
| 6,986,109 B2 | 1/2006 | Allen et al. | |
| 7,062,729 B2 | 6/2006 | Gray et al. | |
| 2002/0187770 A1 | 12/2002 | Grover et al. | |
| 2004/0117753 A1 | 6/2004 | Kahng et al. | |
| 2005/0096771 A1 | 5/2005 | Denton et al. | |
| 2006/0064661 A1* | 3/2006 | Gray et al. ................ | 716/9 |
| 2006/0101356 A1* | 5/2006 | Allen et al. ................ | 716/3 |
| 2007/0245283 A1 | 10/2007 | Allen et al. | |
| 2007/0277129 A1 | 11/2007 | Allen et al. | |
| 2008/0208719 A1 | 8/2008 | Sharma et al. | |

OTHER PUBLICATIONS

Gray et al., U.S. Appl. No. 11/782,706, filed Jul. 25, 2007, Notice of Allowance and Fee(s) Due dated Mar. 9, 2010, 7 pages.
IBM, "A Method for Hierarchical Minimum-Pedubation VLSI Layout Optimization with Integer Constraints That Modifies Transform Locations and Contents", Jun. 3, 2005, pp. 1-4, IP.com, Inc., IP.com No.: IPCOM000125493D.

(Continued)

*Primary Examiner* — Jack Chiang
*Assistant Examiner* — Patrick Sandoval
(74) *Attorney, Agent, or Firm* — Richard M. Kotulak; Hoffman Warnick LLC

(57) ABSTRACT

An approach that obtains a feasible integer solution in a hierarchical circuit layout optimization is described. In one embodiment, a hierarchical circuit layout and ground rule files are received as input. Constraints in the hierarchical circuit layout are represented as an original integer linear programming problem. A relaxed linear programming problem is derived from the original integer linear programming problem by relaxing integer constraints and using relaxation variables on infeasible constraints. The relaxed linear programming problem is solved to obtain a linear programming solution. Variables are then clustered, and at least one variable from each cluster is rounded to an integer value according to the linear programming solution. Next, it is determined whether all the variables are rounded to integer values. Unrounded variables are iterated back through the deriving of the integer linear programming problem, solving of the relaxed linear programming problem, and rounding of a subset of variables. A modified hierarchical circuit layout is generated in response to a determination that all the variables are rounded to integer values.

15 Claims, 17 Drawing Sheets

OTHER PUBLICATIONS

Lee et al., "Himalayas—A Hierarchical Compaction System with a Minimized Constraint Set," Aug. 1992, pp. 150-157, IEEE.

Marple, "A Hierarchy Preserving Hierarchical Compactor," 1990, pp. 375-381, 27th ACM/IEEE Design Automation Conference.

Gray et al., U.S. Appl. No. 11/782,706, Office Action Communication, Sep. 21, 2009, 8 pgs.

Gray et al., U.S. Appl. No. 11/782,706, Office Action Communication, Apr. 2, 2009, 11 pgs.

* cited by examiner

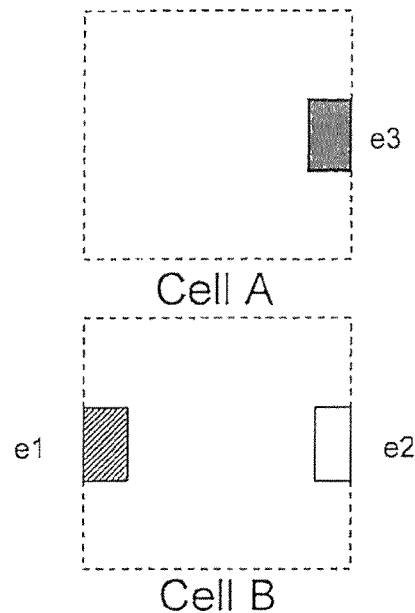
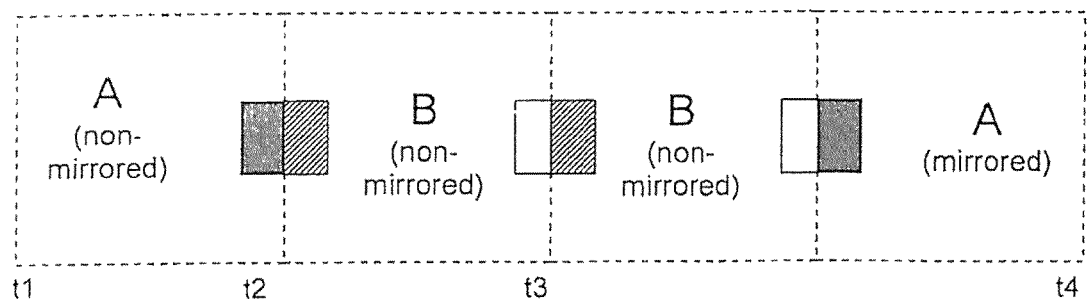
FIG. 18

METHODS TO OBTAIN A FEASIBLE INTEGER SOLUTION IN A HIERARCHICAL CIRCUIT LAYOUT OPTIMIZATION

This application claims priority to, and is a continuation in part application of, U.S. patent application, Ser. No. 11/782,706, filed on Jul. 25, 2007, entitled OBTAINING A FEASIBLE INTEGER SOLUTION IN A HIERARCHICAL CIRCUIT LAYOUT OPTIMIZATION, the contents of which are hereby incorporated by reference.

BACKGROUND

This disclosure relates generally to hierarchical circuit layout optimization, and more specifically to obtaining a feasible integer solution in a hierarchical circuit layout optimization.

Layout optimization is a powerful technique for design migration, circuit performance tuning and design for manufacturing. For example, with layout optimization, a symbolic layout can be compacted to minimize the total area of a circuit design, a crude layout can be legalized to meet a set of design ground rules, a layout can be migrated from one technology to another, critical nets can be spaced farther apart to reduce coupling noise, device sizes can be changed to improve circuit performance, wires of a layout can be spread apart to make use of white space to improve the random defect yield, and critical features can be modified to remove lithography hot spots.

In modern very large scale integration (VLSI) designs, layout optimization is becoming more important as layouts and design ground rules become more complicated. For layout optimization of a typical VLSI design, not only geometric objects in the layouts must pass design ground rule checking in terms of spacing, width, etc., but also locations of the objects must be integer due to a requirement imposed by the structures of industrial layout databases and manufacturing considerations. In older technologies, directly rounding the real value obtained by layout optimization tools to the nearest manufacturing grid may be sufficient to meet design rule constraints. However, in modern deep sub-micron technologies where the manufacturing grid can be as small as 1 nanometer (nm) and the design rule value can be very close to the grid value, such trivial rounding may not work well and lead to design rule violation. Therefore, the integer requirement on the locations of the geometric objects has become more critical in modern VLSI circuit layout optimization.

One type of circuit layout optimization technique that has applicability to hierarchical layouts is a flat layout optimization. Flat layout optimization techniques are generally formulated as a special form of linear programming, which includes only two-variable difference constraints. To take advantage of this property, a graph-based algorithm is used to speed up the computation. However, flat layout optimization techniques have limits in applications. In particular, flat layout optimization techniques are unable to handle layout hierarchy and have difficulty handling a large problem size. Thus, the typical layouts that these flat layout optimization techniques can operate on are shapes in library cells, shapes in small flat macros, and wires residing at one level of design hierarchy of a large layout.

As a result, flat layout optimization techniques do not work very well for a VLSI chip design such as a microprocessor that is organized hierarchically with many levels of design hierarchy with different orientations. The hierarchical representation of a VLSI layout not only carries designers' intent, but also makes design checking and verification easier. If a hierarchical design is flattened in order to apply flat layout optimization techniques, the designers' intent such as repetitions, mirroring and rotations of cells will be lost. Moreover, the flattening will cause the problem size to increase dramatically. For example, given a layout consisting of n instances of a cell A, then it is assumed that there are v variables to be optimized in the cell A. Then, there will be n*v variables to represent the shapes in the flattened layout, while the hierarchical layout can be modeled by using only n+v variables. On the other hand, if flat layout optimization techniques are used with a hierarchical design in a bottom-up or top-down fashion, i.e., applying the flat approaches on part of the design based on the design hierarchy, then the global view for optimization may be lost and it may lead to a sub-optimal solution or even fail to find a feasible solution.

As a result, it has become necessary to develop hierarchical layout optimization techniques. Generally, the hierarchical layout optimization problem is formulated as a linear programming problem; however, as noted above, the principal requirement in layout modification is that the resultant shape edge and cell locations must be integer. The integer requirement of the layout locations gives rise to integer programming problems when attempting to use optimization techniques on the hierarchical layouts. Previous hierarchical layout optimization techniques have focused on the hierarchical layout compaction problems that are solved as an integer linear programming problem (ILP) using general purpose ILP solvers. These approaches suffer run-time problems with large designs.

It is well-known that ILP is an NP-hard problem. Another drawback is that a general purpose ILP solver has a difficult time handling conflicting input constraints and will often fail to return a solution. Various attempts have been made to overcome these problems, but these approaches suffer from additional problems caused by integer constraints such as failing to meet abutment/alignment constraints. Failing to meet abutment/alignment constraints result in pull-apart and/or misalignment of complicated VLSI designs. A pull-apart causes an open circuit. A misalignment causes a design rule violation. Both of them have to be avoided in a hierarchical layout optimization.

Therefore, it is desirable to develop a technique that can solve the large hierarchical layout optimization problem by optimizing both cell locations and shape edge locations at the same time, while preventing pull-apart and misalignment.

SUMMARY

In one embodiment, there is a method for obtaining a feasible integer solution in a hierarchical circuit layout optimization, comprising: receiving a hierarchical circuit layout and ground rule files; representing constraints in the hierarchical circuit layout as an original integer linear programming problem; deriving a relaxed linear programming problem from the original integer linear programming problem by relaxing integer constraints and using relaxation variables on infeasible constraints; solving the relaxed linear programming problem to obtain a linear programming solution; rounding at least one variable to an integer value according to the linear programming solution using a clustering approach; iterating unrounded variables back through the deriving, solving, and rounding processes until all of the variables are rounded to integer values; and generating a modified hierarchical circuit layout in response to a determination that all the variables are rounded to integer values.

In a second embodiment, there is a computer-readable storage medium storing computer instructions, which when executed, enables a computer system to obtain a feasible integer solution in a hierarchical circuit layout optimization, the computer instructions comprising: program code for receiving a hierarchical circuit layout and ground rule files; program code for representing constraints in the hierarchical circuit layout as an original integer linear programming problem; program code for deriving a relaxed linear programming problem from the original integer linear programming problem by relaxing integer constraints and using relaxation variables on infeasible constraints; program code for solving the relaxed linear programming problem to obtain a linear programming solution; program code for rounding at least one variable to an integer value according to the linear programming solution using a clustering approach; program code for iterating unrounded variables back through the program code for deriving, solving, and rounding until all of the variables are rounded to integer values; and program code for generating a modified hierarchical circuit layout in response to a determination that all the variables are rounded to integer values.

In a third embodiment, there is a system for obtaining a feasible integer solution in a hierarchical circuit layout optimization, comprising: at least one computer processor; and at least one memory device operatively coupled to the at least one computer processor, the system comprising: a module for receiving a hierarchical circuit layout and ground rule files; a module for representing constraints in the hierarchical circuit layout as an original integer linear programming problem; a module for deriving a relaxed linear programming problem from the original integer linear programming problem by relaxing integer constraints and using relaxation variables on infeasible constraints; a module for solving the relaxed linear programming problem to obtain a linear programming solution; a module for rounding at least one variable to an integer value according to the linear programming solution using a clustering approach; a module for iterating unrounded variables back through the deriving, solving, partitioning and rounding modules until all of the variables are rounded to integer values; and a module for generating a modified hierarchical circuit layout in response to a determination that all the variables are rounded to integer values.

BRIEF DESCRIPTION OF THE DRAWINGS

FIG. 18 shows an example of implicit self-mirrored-abutted edge variables in accordance with an embodiment of the invention;

DETAILED DESCRIPTION

Embodiments of this disclosure are directed to a technique that solves the large hierarchical layout optimization problem noted above by using an iterative rounding and linear programming solving (IRLS) algorithm to optimize both cell locations and shape edge locations at the same time, while solving any pull-apart and misalignment problems. This permits automatic layout modification to be performed on the existing hierarchical layouts guided by an objective function subject to the linear constraints such as ground rule constraints and integer constraints. In particular, the IRLS algorithm uses a proper rounding strategy to iteratively round real-value results returned by a linear programming (LP) solver to integer values, thus avoiding enormous run-time in solving the general integer linear programming (ILP) problem which is typically solved by the branch-and-bound approach. The rounding strategy includes rounding the variables which represent shape, edge and cell locations to integers iteratively by solving a sequence of relaxed LP problems with consideration of the whole hierarchical constraints. The rounding strategy is designed based on the analysis of the hierarchical layout constraints and results in control of the solving process, resolution of conflicts in the input of constraints, and maximization in the chance of finding a feasible integer solution.

Figure 1:
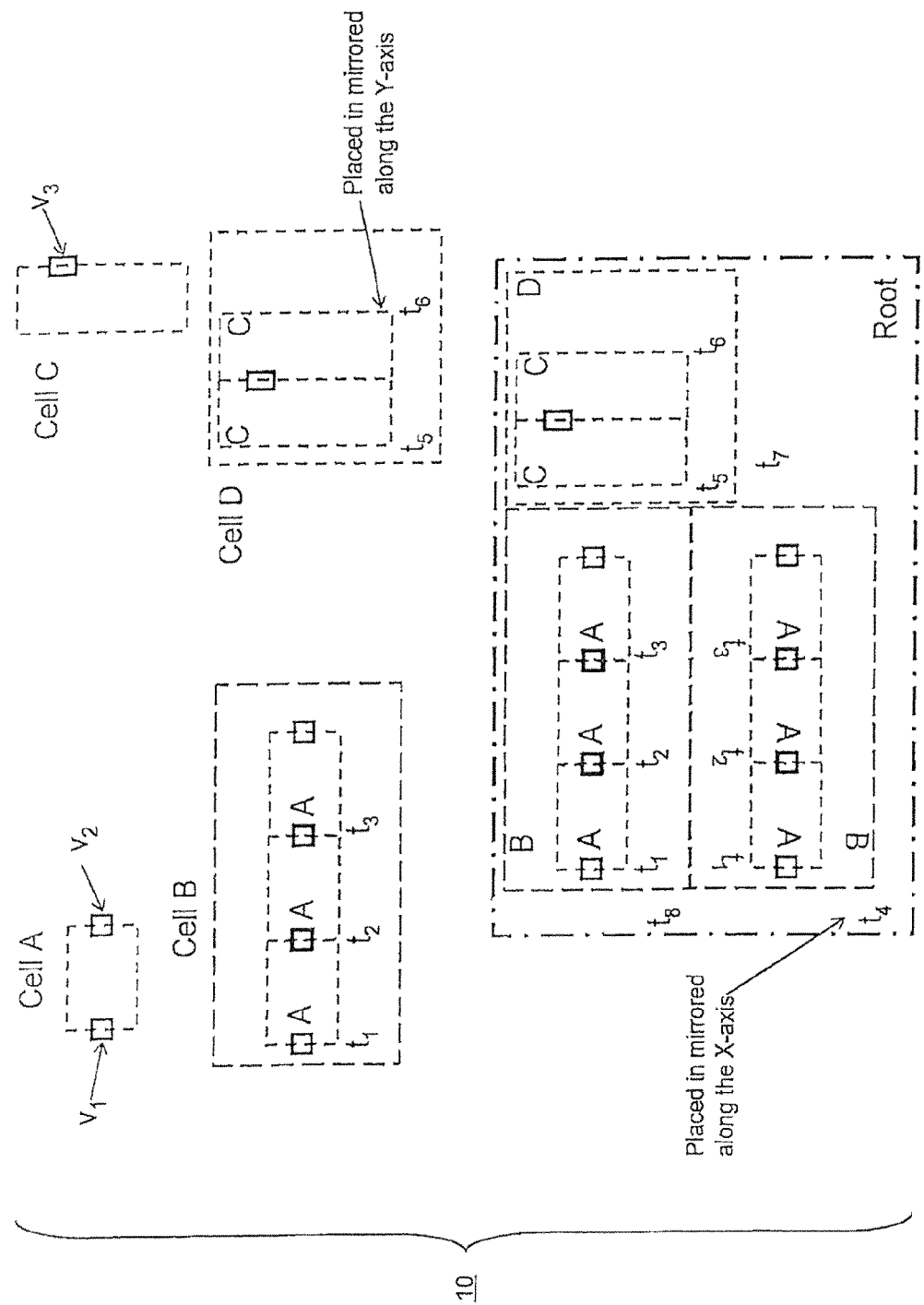
FIG. 1 is an example of an hierarchical circuit layout.

A typical hierarchical circuit layout is organized hierarchically as a set of cells each containing polygon shapes and nested transformations (instances) of other cells. A cell is defined once and can be instantiated or referenced as a transformation many times. When a cell is referenced, the absolute coordinates of the shapes defined in the cell are computed by applying a reference transformation. FIG. 1 shows an example of a hierarchical circuit layout 10. The hierarchical circuit layout 10 of FIG. 1 contains a root cell representing the whole hierarchical layout. There are four cells in the hierarchy, cell A, B, C and D. Cell A contains two shapes $v_1$ and $v_2$. Cell B contains three instances of cell A which are placed adjacently one to another horizontally at transformations $t_1$, $t_2$, and $t_3$ such that shape $v_2$ from the left instance completely overlaps with shape $v_1$ from the right instance. Cell C contains one shape $v_3$. Cell D contains two instances of cell C which are placed adjacently horizontally at transformations $t_5$ and $t_6$, and one is mirrored along the Y axis such that shapes $v_3$ from both instances completely overlap. The root cell contains two instances of cell B which are vertically adjacent to each other at transformations $t_4$ and $t_8$, and the bottom instance is mirrored along the X axis, and one instance of cell D at transformation $t_7$.

Figure 2:
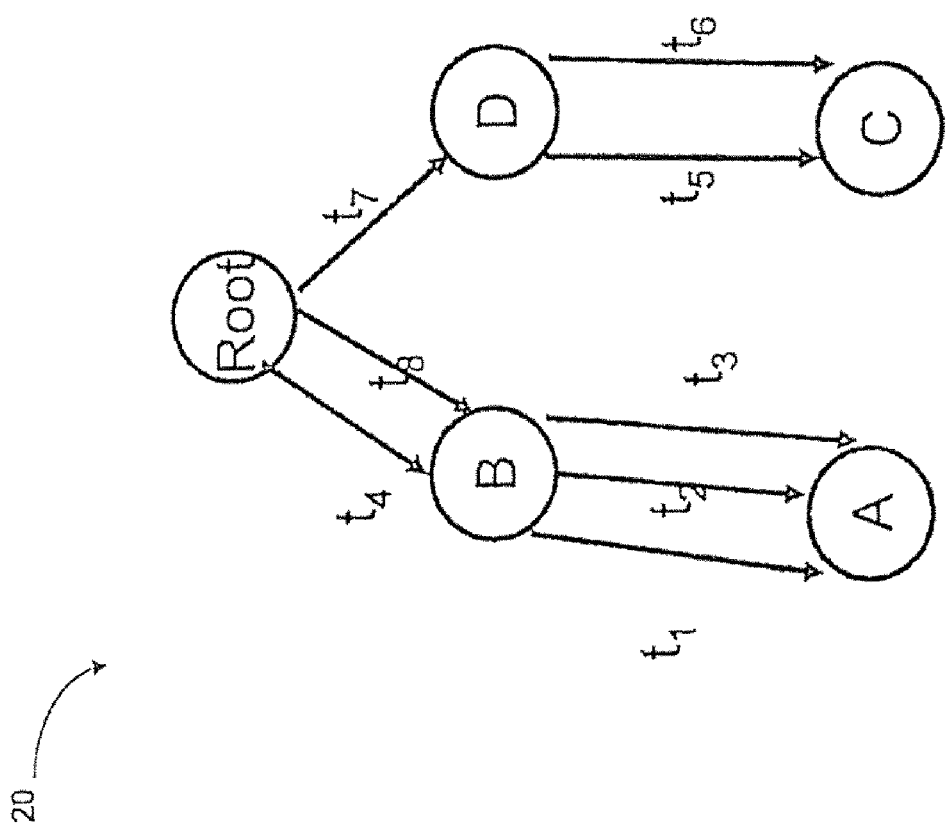
FIG. 2 is an example of a hierarchy graph of the hierarchical circuit layout shown in FIG. 1.

The overall hierarchy structure in the hierarchical layout can be represented by a hierarchy graph. FIG. 2 is an example of a hierarchy graph 20 of the hierarchical circuit layout 10 shown in FIG. 1 that is rooted, directed and acyclic. The arcs in the hierarchy graph 20 correspond to transformations and nodes correspond to cells. In particular, the hierarchy graph 20 shows that cell B is placed twice in the root cell and that there are two transformations ($t_4$ and $t_8$) of cell B. The hierarchy graph 20 also shows that cell A is placed three times in each cell B and that there are three transformations ($t_1$, $t_2$ and $t_3$) of cell A. The hierarchy graph 20 shows that cell D is placed once in the root cell and that there is one transformation ($t_7$) of cell D. Also, the hierarchy graph 20 shows that the cell C is placed twice in cell D and that there are two transformations ($t_5$, and $t_6$) of cell C.

In a hierarchical circuit layout, the design ground rule constraint is specified between a pair of flat edges. The flat edge is represented by $\epsilon_i$ for an edge $e_i$ with instance path $T_{in} \Theta T_{in-1} \ldots \Theta T_{i1}$ and $\epsilon_j$ represents the flat edge for $e_j$ with instance path $T_{jm} \Theta T_{jm-1} \ldots \Theta T_{j1}$. Then the constraint in the x-direction is represented by a formula of the form:

$$\epsilon_j(x, T_{jm} \Theta T_{jm-1} \ldots \Theta T_{j1}) - \epsilon_i(x, T_{in} \Theta T_{in-1} \ldots \Theta T_{i1}) \geq d_{ij}$$

Figure 3:
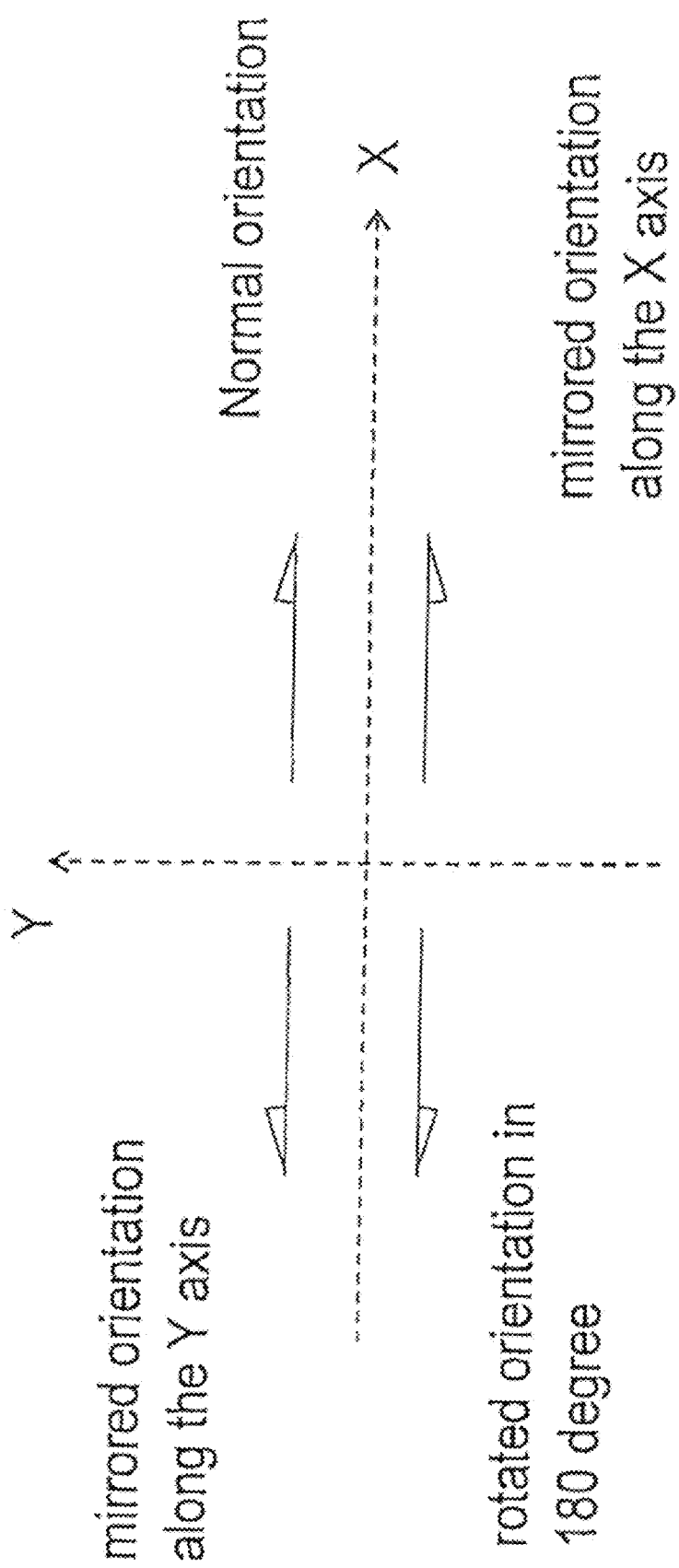
FIG. 3 shows an orientation of the cells shown in the hierarchical circuit layout of FIGS. 1-2.

Without loss of generality, discussion of this disclosure is limited to those four orientations of cells (normal orientation, mirrored orientation along the X axis, mirrored orientation along the Y axis, and rotated orientation in 180 degree, see FIG. 3) restricted by the restrictive design rules. Thus, the form is equivalent to:

$$(t_{j_m}(x) \pm t_{j_{m-1}}(x) \ldots \pm t_{j1}(x) \pm e_j(x)) - (t_{in}(x) \pm t_{in-1}(x) \ldots \pm t_{i1}(x) \pm e_i(x)) \geq d_{ij}$$

Figure 4:
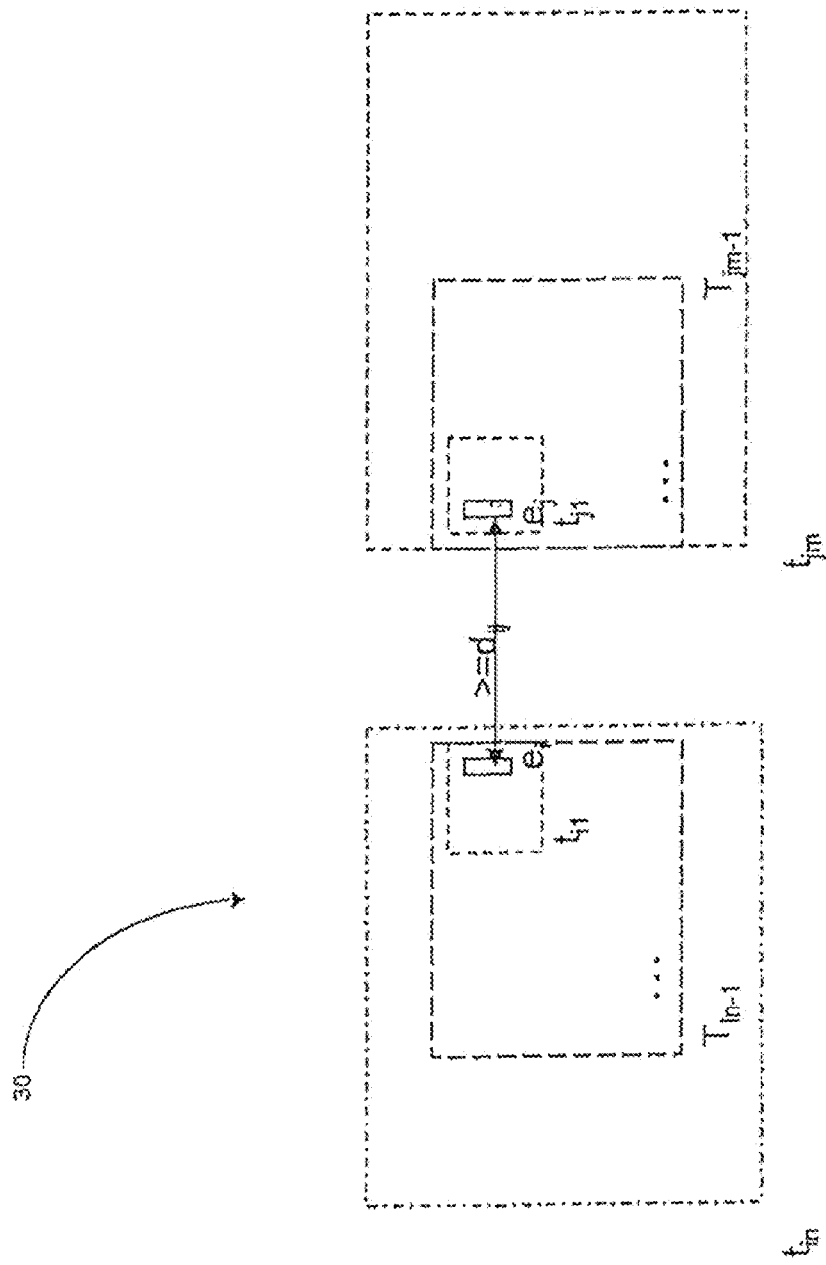
FIG. 4 illustrates an example of a hierarchical constraint between two shape edges in a hierarchical circuit layout.

FIG. 4 illustrates an example of a hierarchical constraint 30 between two shape edges in a hierarchical circuit layout. In particular, FIG. 4 illustrates the above hierarchical constraint formula between two flat edges $\epsilon_i$ and $\epsilon_j$ whose corresponding edge variables are $e_i$ and $e_j$, respectively.

Typically, hierarchical circuit layout optimization also known as legalization is performed in two successive steps; first, in the x-direction and then in the y-direction, or vice-versa. Successive one-dimension (1-D) legalizations can meet most of the ground rule constraints in a realistic layout optimization environment and are capable of producing good results in practice with much less run time compared to a two-dimensional (2-D) legalization. When 2-D constraints appear, usually they are decomposed into 1-D constraints and legalized by an iterative 1-D optimization. In this disclosure, there is one embodiment that describes an approach directed to the 1-D legalization/optimization. Without loss of generality, the approach is described in the x-direction. For simple presentation, e is used to represent e(x) and t to represent t(x).

The legalization problem with minimum layout perturbation objective is formulated as follows:

$$\min\left(\sum_i w_i |t_i - t_i^{old}| + \sum_j w_j |e_j - e_j^{old}|\right)$$

subject to:

$$(t_{jm} \pm t_{jm-1} \pm \ldots \pm t_{j1} \pm e_j) - (t_{in} \pm t_{in-1} \ldots \pm t_{i1} \pm e_i) \geq d_{ij}$$

wherein $t_i$ represents the transformation variable and $t_i^{old}$ is the original value of $t_i$ in the input layout, $e_j$ represents the edge variable, and $e_j^{old}$ is the original value of $e_j$ in the input layout, $w_i$ and $w_j$ are the weights for the layout perturbation cost of the transformation location and edge location, respectively. The absolute value objective is a special case of convex piecewise linear objective. In the minimum layout perturbation driven layout migration process from one technology to another where scaling the layout based on the given scaling factor is followed by legalizing it to meet design ground rules, the problem is formulated in the same way where $t_i^{old}$ and $e_j^{old}$ are the scaled values of the transformation and edge locations.

The compaction problem to minimize area is formulated as follows:

$$\min\{x_{max}\}$$

subject to:

$$(t_{jm} \pm t_{jm-1} \pm \ldots \pm t_{j1} \pm e_j) - (t_{in} \pm t_{in-1} \ldots \pm t_{i1} \pm e_i) \geq d_{ij}$$

The above problem formulation for a large hierarchical layout optimization is solved in this disclosure by using the IRLS algorithm, which as mentioned above, is an iterative flow where the variables are rounded to integers step by step to solve the large hierarchical layout optimization problem. In each iteration, based on the LP result, the IRLS algorithm rounds one or more variables to integers. The LP problem includes both transformation variables and edge variables, and thus a global view can be obtained to optimize both variables simultaneously. Compared with ILP or Mixed ILP (MILP) solvers, the general LP solvers usually can handle large-size problems in modern computers. The variables, which are rounded to integers in earlier iterations become constants for later LP problems, and thus the sizes of the LP problems become smaller and smaller. The IRLS algorithm relies on a specific order designed to round the variables which are vital to meet the abutment/alignment constraints and prevent pull-apart and misalignment.

Figure 5:
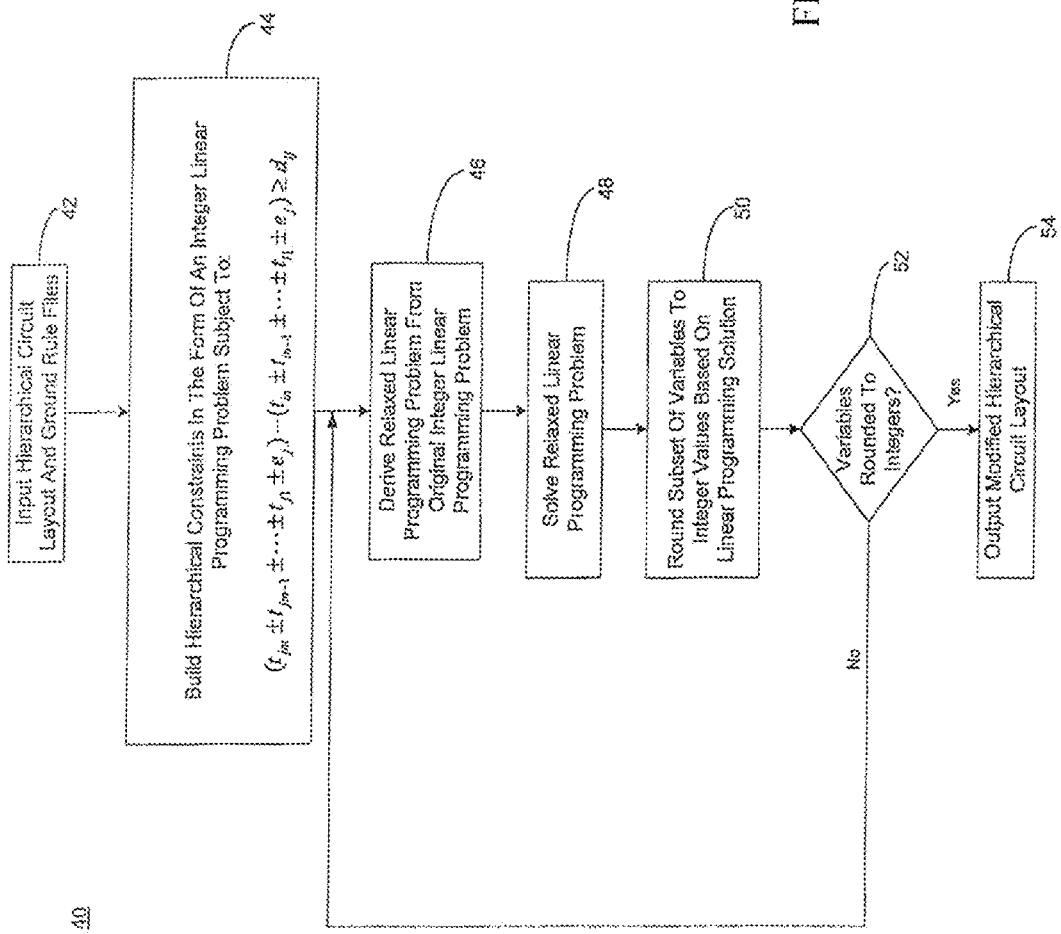
FIG. 5 is a flow chart describing a process for solving a problem formulation for a large hierarchical layout optimization according to one embodiment of this disclosure.

FIG. 5 is a flow chart 40 describing operations performed by the IRLS algorithm to solve the problem formulation for large hierarchical layout optimization according to one embodiment of this disclosure. In addition to describing how the IRLS algorithm solves the problem formulation, the flow chart 40 describes how the IRLS algorithm optimizes both shape edge location variables and cell transformation variables at the same time.

The operations of the flow chart 40 begin by first receiving an input layout of a hierarchical circuit and ground rule files at 42. The ground rules are defined in the ground rule files to ensure manufacturability. Typically ground rules include spacing rules specifying the minimum space between objects, width rules specifying the minimum width of some objects, and methodology rules specifying the design requirement for assembling cells. Next, constraints in the hierarchical circuit layout are represented as an original ILP problem at 44. In particular, the representing of constraints comprises building hierarchical constraints in a form of inequality expressions. In one embodiment, the hierarchical constraints are built in the form of:

$$(t_{jm} \pm t_{jm-1} \ldots \pm t_{j1} \pm e_j) - (t_{in} \pm t_{in-1} \ldots \pm t_{i1} \pm e_i) \geq d_{ij}$$

$t_j, e_i$ must be integer

At 46, a relaxed LP problem is derived from the original ILP problem by relaxing integer constraints and using relaxation variables on infeasible constraints. As used herein, relaxing integer constraint means that certain constraints are not applied. For example, one might not require an integer for all variables or a variable could be made non-variable. As used herein, infeasible constraints are constraints that are not satisfied for the given layout. Note that the layout may be the original layout or the layout based on the partial rounding results obtained during the rounding iterations. The infeasible constraints are relaxed by a well-known method such as the Lagrangian Relaxation method.

The relaxed LP problem is then solved to obtain a LP solution at 48 by using any well-known LP solver such as the Simplex method. After solving the relaxed LP problem, a subset of variables from the relaxed linear programming problem is rounded to integer values according to the LP solution at 50. Below are further details on the rounding of the variables to integer values. If it is determined at 52 that not all of the variables are rounded to integer values, then this is an indication that a partial solution to the original ILP problem exists. In this case, the operations performed at 46 (deriving relaxed LP problem), 48 (solving relaxed LP problem), 50 (rounding variables to integer values) and 52 (determining if all variables are rounded) are repeated until the values of all variables are rounded. Note that each time the assigned variables become rounded, the IRLS algorithm treats them as constants and thus the size of the LP problem becomes smaller.

Once it is determined at 52 that all of the variables are rounded into integer values, a modified hierarchical circuit layout is outputted at 54. The modified layout meets the ground rules and is optimal in terms of the objective.

Figure 6B:
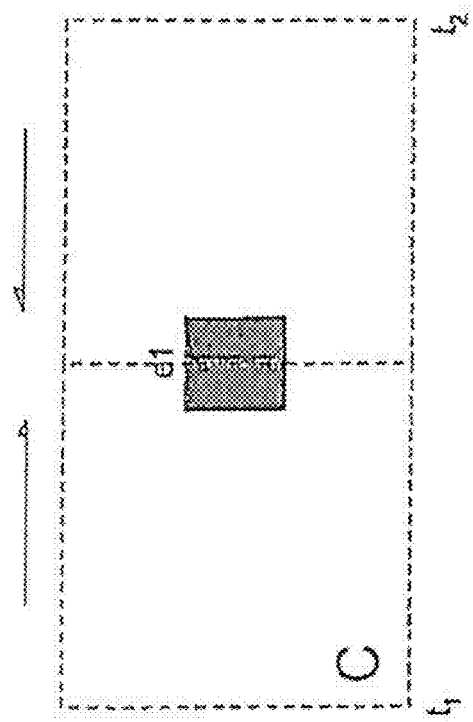
FIGS. 6A-6B show an example of equal constraints involving one edge variable which is referred to as self-mirrored-abutted edge variable.
Figure 6A:
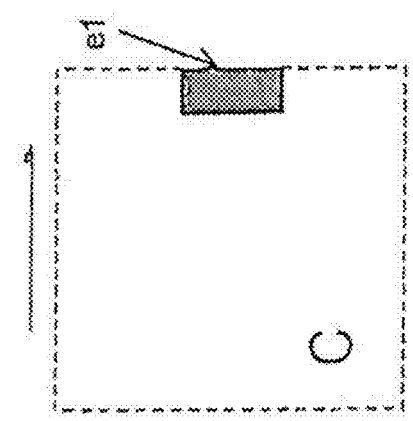

An important part of the IRLS algorithm is the rounding operation 50. Based on careful analysis of hierarchical layouts a rounding strategy has been developed including three rules. FIGS. 6A-6B show an example of a need for one of the rules incorporated in the rounding strategy utilized by the IRLS algorithm. In particular, FIGS. 6A-6B show an example of equal constraints involving one edge variable. As shown in FIGS. 6A-6B, a cell C has a shape $e_1$ ($e_1$ is a via in this case) and a layout consists of two instances of the cell (the two instances are mirrored and placed adjacent to each other such that the two $e_1$ edges are exactly overlapped). In terms of constraints, this relationship is specified by:

$$(t_1+e_1)-(t_2-e_1)=0$$

$$\Rightarrow t_2-t_1=2e_1$$

Since all variable must be integers, it means that $t_2-t_1$ must be an even number. If $t_1$ and $t_2$ happened to be rounded first and $t_2-t_1$ is not even, then one will fail to get an integer solution for $e_1$. Therefore, $e_1$ needs to be rounded before $t_1$, $t_2$ or both of them. In general, these types of constraints are referred to as "equal constraints involving only one edge variable" and the edge variable is referred to as "self-mirrored-abutted edge variable". In order to deal with equal constraints involving only one edge variable, the IRLS algorithm uses the following rounding rule:

In equal constraints involving only one edge variable, the edge is rounded before the transformation variables. (Rule 1)

Figure 7B:
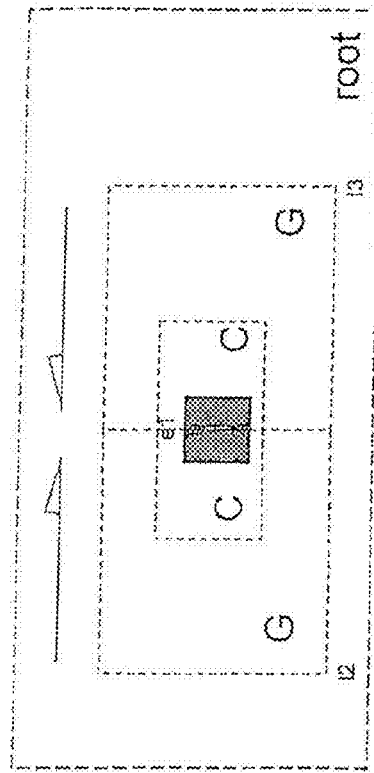
FIGS. 7A-7B show an example of rounding in a Depth First Search (DFS) order.
Figure 7A:
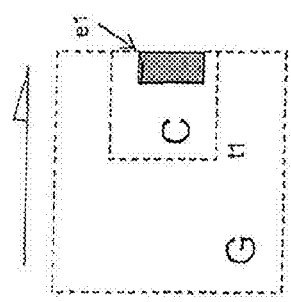

Similarly, an equal constraint involving only one edge variable may extend to involve transformation variables. As shown in FIGS. 7A-7B, a cell C has a shape $e_1$ ($e_1$ is a via), a cell G has an instance of cell C and a layout consists of two instances of cell G (the two instances are mirrored and placed adjacent to each other such that the two shapes $e_1$ are exactly overlapped). The constraints of the relation are specified as follows:

$$(t_2+(t_1+e_1))-(t_3-(t_1+e_1))=0$$

$$\Rightarrow t_3-t_2=2t_1+2e_1$$

Figure 8:
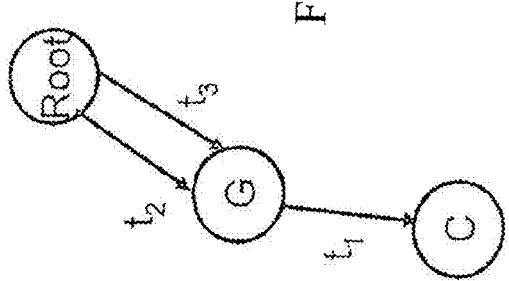
FIG. 8 shows an example of a hierarchy graph for layout shown in FIG. 7B.

Again, $t_3-t_2$ must be an even number. According to Rule 1, $e_1$ is rounded first. It may be difficult to get an integer value for $t_1$ if $t_1$ is rounded last. Therefore, to be safe, the transformation variables are rounded in the order of $t_2$, $t_1$, $t_3$, which is the Depth-First-Search (DFS) order on the edges in the hierarchy graph as shown in FIG. 8. In order to deal with the transformation variables, the IRLS algorithm uses the following rounding rule:

The transformation variables are rounded in the order of Depth-First-Search (DFS) order on the edges in the hierarchy graph (Rule 2)

More specifically, the arcs (the transformations) are visited in the hierarchy graph of the layout in the DFS in order to get the order for transformations.

Figure 9:
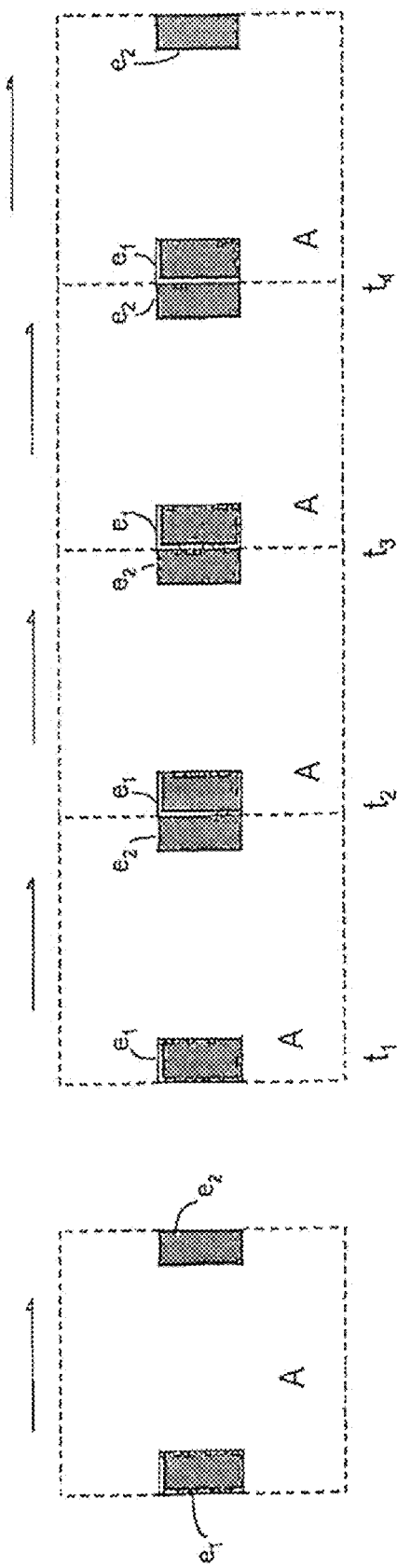
FIGS. 9A-9B show an example for rounding transformation variables at the same level of a layout.

As shown in FIGS. 9A-9B, a cell A has two shapes $e_1$ and $e_2$ (two vias in the case shown), and a layout that consists of a chain of instances of the cell in the same orientation (the vias in the two adjacent instances are exactly overlapped). The constraints of the relation are specified as follows:

$$(t_1+e_2)-(t_2+e_1)=0$$

$$(t_2+e_2)-(t_3+e_1)=0$$

$$\Rightarrow t_1-t_2=t_2-t_3$$

$$\Rightarrow t_1+t_3=2t_2$$

Thus $t_1+t_3$ must be an even number as all the variables must be integers. Rounding $t_2$ after $t_1$ and $t_3$ may fail to obtain the feasible solution. Thus, the transformation variables are rounded in the order of $t_1$, $t_2$, $t_3$. In order to deal with the transformation variables at the same level of the layout, the IRLS algorithm uses the following rounding rule:

In the same level of the hierarchy graph, the transformation variables are rounded in the non-decreasing order of their original locations, from left to right and bottom to top. (Rule 3)

That is, when visiting the hierarchy graphs in the DFS order, the arcs at the same level are sorted based on non-decreasing order of the locations of their corresponding transformations.

It should be noted that rounding the transformation variables in the DFS order provides a natural way to determine the cell locations. For example, first place a big cell, then place the cells inside the cell, and then consider other instances regarding physical locations. The root-to-leaf order along hierarchy may give more flexibility to obtain a feasible solution. For instance, in the hierarchical layout as shown in FIG. 1, whose hierarchy graph is shown in FIG. 2, the rounding order is $t_4$, $t_1$, $t_2$, $t_3$, $t_8$, $t_7$, $t_5$, $t_6$.

With Rules 1-3 in place, the rounding strategy can be formulated for use in the rounding operation 50 shown for FIG. 5. In one embodiment, the rounding strategy for rounding the subset of variables comprises partitioning the subset into at least one of three groups comprising edge variables in equal constraints involving only one edge variable (Group 1), transformation variables (Group 2) and other edge variables (Group 3). Each of the groups (Groups 1-3) that variables are partitioned into has their own respective order for rounding the variables. In particular, variables partitioned into Group 1 are rounded in a random order. Variables partitioned into Group 2 are rounded one by one in the order of a DFS order of arcs in a hierarchy graph that is representative of the hierarchical circuit layout. Also variables partitioned into Group 2 are rounded one by one in the non-decreasing order of original locations of transforms within each level of the hierarchical circuit layout. Variables partitioned into Group 3 are rounded by transforming the constraints and objectives associated with the edge variables that have non-integer value obtained from LP solving to a Boolean 2-satisfiability (2-SAT) problem, solving the 2-SAT problem by assigning true or false to the variables, and rounding variables assigned true to their ceiling value and rounding variables assigned false to their floor value.

The edge variables in Group 1 can be rounded with no specific order, while the transformation variables should be rounded one by one based on the proposed ordering. If a transformation variable is already an integer after solving the LP problem, then the next transformation variable in the order can be rounded. When it comes to rounding the rest of edge variables in Group 3, then the problem is actually an LP problem with no more than two variables per each constraint (difference and sum constraints), as the values for edge variables in Group 1 and transformation variables in Group 2 are already determined. Therefore, the variables can be rounded in one iteration efficiently using known techniques. In practice, the results of solving LP problems already contain many integers for both the transformation and edge variables, so the actual number of iterations between rounding and LP problem solving is much smaller than the number of transformation variables.

In addition to the above rounding strategy, there is in one embodiment a rounding decision methodology for rounding a real value to an integer. The rounding decision methodology includes direct rounding and binary rounding. Direct rounding and binary rounding are as follows:

Direct Rounding: when the real value r returned by the LP solver is within a small margin δ to its nearest integer value k i.e., |r−k|≦δ, treat it as an integer by directly rounding to k; and Binary Rounding: when the real value r returned by the LP solver, is not within the small margin δ to its nearest integer value k i.e., |r−k|<δ, round to its floor/ceiling based on the number of infeasible constraints;

Re-evaluating constraints in the original ILP problem using the floor/ceiling value, checking if the rounded value of the variable causes violations of the given constraints, i.e., infeasible constraints; and choosing the one which causes fewer infeasible constraints.

Figure 10:
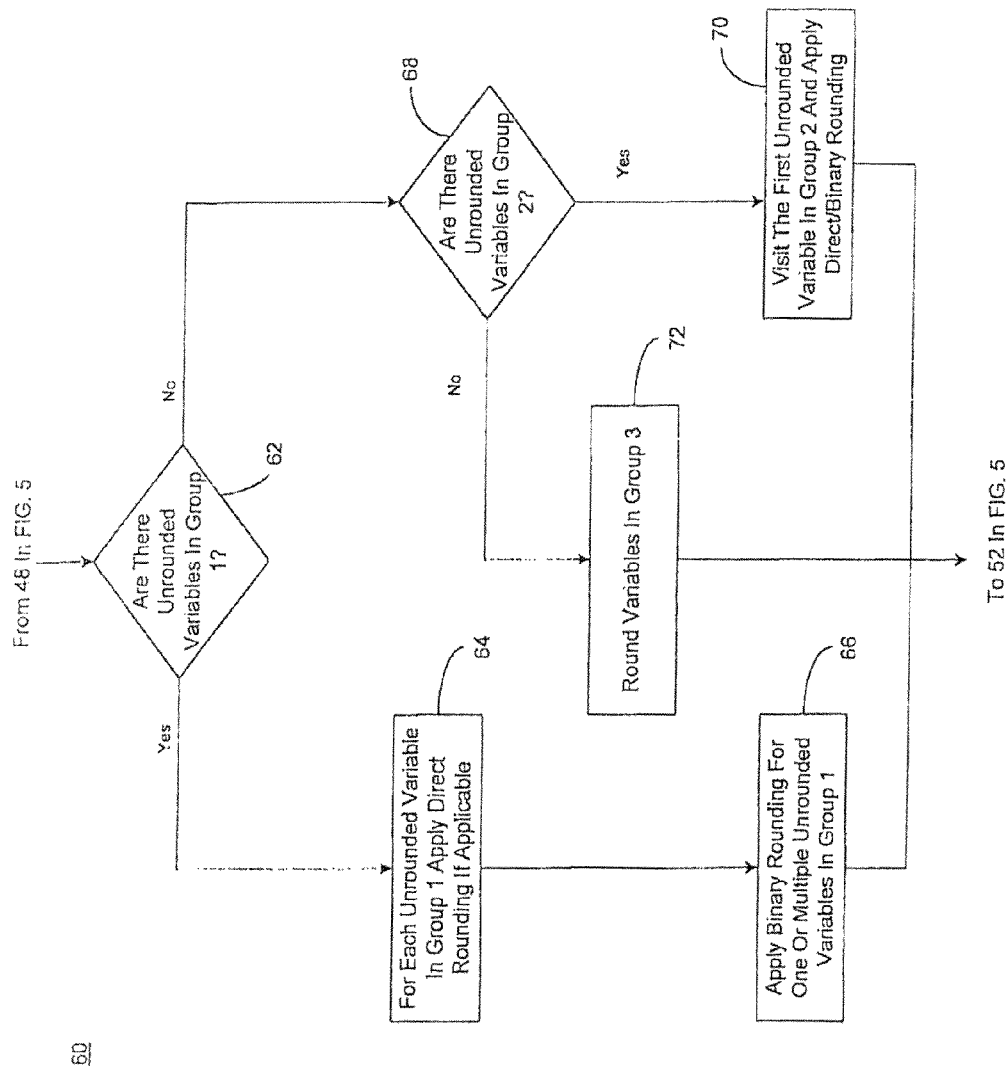
FIG. 10 shows a flow chart describing the rounding operation shown in FIG. 5.

FIG. 10 shows a flow chart 60 describing the rounding operation shown in FIG. 5. In particular, FIG. 10 shows how the rounding strategy described above is implemented to perform the rounding of variables to integers. The flow chart 60 begins by receiving the LP solution from operation 48 of FIG. 5. First, it is determined at 62 whether there are any unrounded variables that exist in Group 1. If there are variables that exist in Group 1, then direct rounding is applied at 64 if applicable. For the rest of the variables, binary rounding is applied at 66.

If it is determined at 62 that none of the unrounded variables exist in Group 1, then it is determined at 68 whether the unrounded variables exist in Group 2. If there are variables that exist in Group 2, then the first unrounded variable in Group 2 is visited and rounded at 70 by applying direct/binary rounding. On the other hand, if there are no variables that exist in Group 2 as determined at 68, then known techniques as described above are used to round variables in Group 3 at 72. As described above for FIG. 5, after performing the rounding operation, a decision is then made to determine if all variables have been rounded to an integer.

Enhanced Methods

In the above described embodiments, it is observed that in some specific cases, the method can be further improved to get better results by identifying the implicit self-mirrored-abutted edge variables and rounding them before rounding the transformation variables.

Also in the above described embodiments, the operational runtime is dictated by the number of iterations that the relaxed linear programming problem is solved (see FIG. 5). This in turn is dictated by the number of self-mirrored-abutted edge variables and the number of transform variables, as well as the number of constraints and variables in each linear programming problem. In order to optimize the process, clustering (also referred to as partitioning) and parallel rounding may be utilized to reduce the number of iterations. Two clustering techniques are proposed for illustrative purposes. The first involves clustering of self-mirrored-abutted edge variables, and the second involves clustering of transformation variables.

Figure 11:
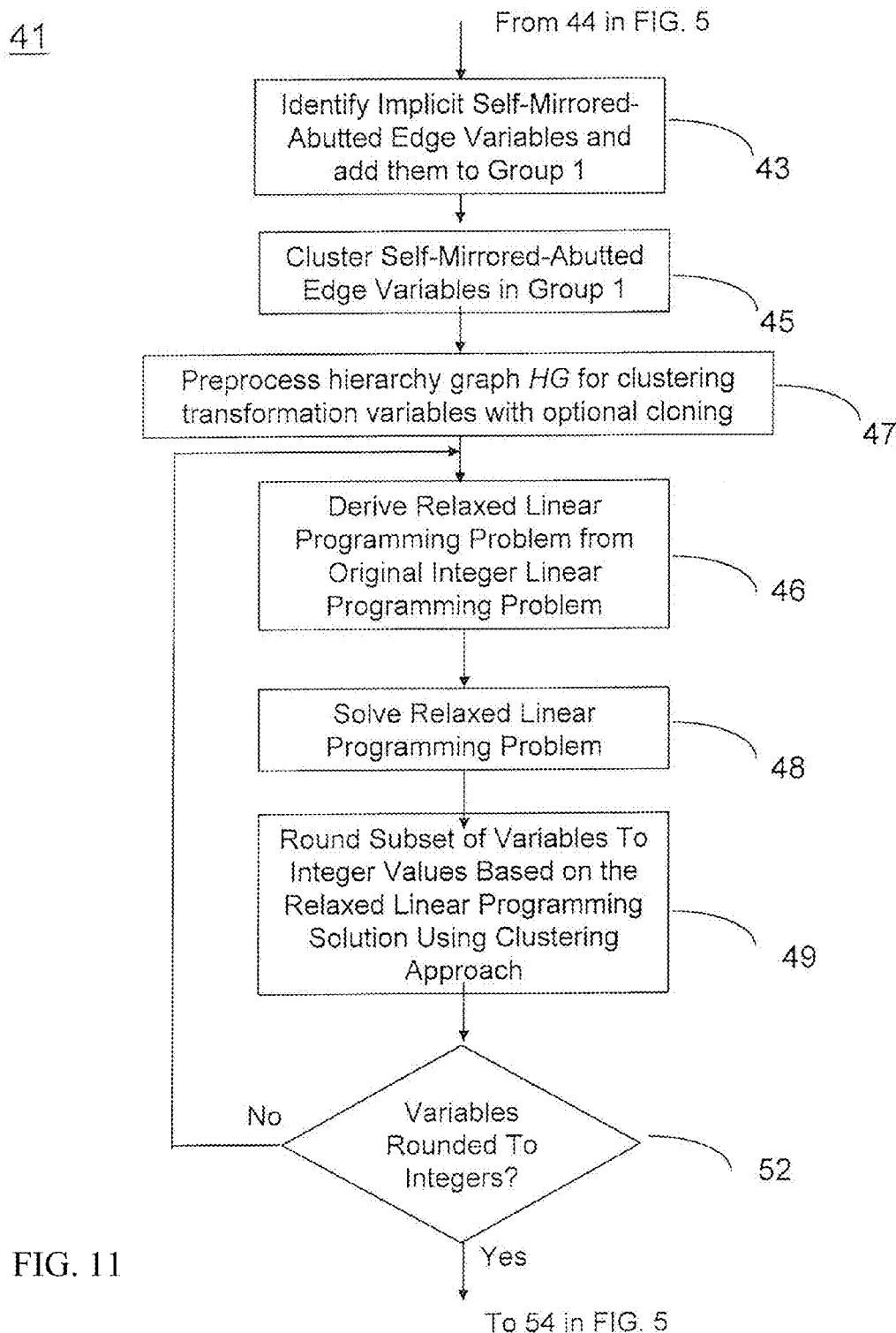
FIG. 11 shows a flow chart showing the iterative process in accordance with an embodiment of the invention.

FIG. 11 shows a diagram of an illustrative implementation 41 for providing the aforementioned three optimizations: identifying implicit self-mirrored-abutted edge variables, clustering self-mirrored-abutted edge variables and clustering transformation variables. Implementation 41 essentially replaces the iterative loop (46, 48, 50) described in FIG. 5. In particular, processes 43, 45, and 47 are added before the iterative loop and process 49 replaces process 50 of FIG. 5. Note that while all three optimizations are described in this embodiment, it is understood that any one or two of them may be implemented independently of the others.

The iterative loop shown in implementation 41 iterates until all of variables have been rounded to integers, as determined at decision point 52. Before the iterative loop starts, implicit self-mirrored-abutted edge variables are identified and added to Group 1 at 43, followed by clustering the self-mirrored-abutted edge variables in Group 1 at 45. In addition, at 47, the hierarchy graph HG is preprocessed for clustering transformation variables with optional cloning. The loop begins with process 46, derive relaxed linear programming problem from original integer linear programming problem and then process 48, solve relaxed linear programming problem, which are described in detail above. Once the relaxed linear programming problem has been solved, variables are rounded process 49, namely, a subset of variables are rounded to integer values based on the relaxed linear programming solution using a clustering approach. Processes 46, 48, and 49 repeat until all variables have been rounded.

The first optimization is to identify implicit self-mirrored-abutted edge variables. FIG. 18 depicts an example of implicit self mirrored abutment, in which instances of two cells Cell A and Cell B are placed adjacently in a row as shown on the bottom. Abutment requires that: t1+e3=t2+e1, t2+e2=t3+e1, t3+e2=t4−e3, which implies: t1+2*t3+e3=2*t2+t4−e3. Accordingly, t4−t1=2*t3−2*t2+2*e3, which means that t4−t1 must be even. e3 is implicitly a self-mirrored-abutted edge variable, and should be rounded before transformation variables are rounded. Although the computation cost of accurately identifying self-mirrored-abutted edge variables is high, it may be worth the computation if the best quality of the results is desired. A relatively low cost method to "approximately" identify implicit self-mirrored-abutted edge variables with linear complexity may be implemented as follows.

First, identify the edge variable, $e_i$, such that there exists at least a set of equal constraints S1 where (+$e_i$) appears and another set of equal constraints S2 where (−$e_i$) appears. Second, check if there exist two transformation variables, $t_i$ appears in S1 and $t_j$ appears in S2 such that are $t_i$ and $t_j$ are related in term of all the equal constraints.

For example, given equal constraints, t1+e3=t2+e1, t2+e2=t3+e1, t3+e2=t4−e3, first identify e3 as it has plus sign and minus sign in equal constraint t1+e3=t2+e1, and t3+e2=t4−e3. Second, identify that t2 and t3 are related via equal constraints, so e3 would be a candidate for self-mirrored-abutted edge variable.

The second optimization is to cluster self-mirrored-abutted edge variables 45 (FIG. 11). In equal constraints involving only one edge variable (i.e., self-mirrored-abutted edge variable), the edge variable is rounded before the transformation variables. These variables are partitioned into clusters based on their interactive transformation variables. Namely, if there exists equal constraints for self-mirrored-abutted edge variable E1, T1+E1=T2−E1, then E1 interacts with T1 and T2. If self-mirrored-abutted edge variables E1 and E2 interact with the same transformation variable, they can be partitioned into the same cluster.

During the iteration, e.g., at process 49, at least one variable from each cluster is rounded. Self-mirrored-abutted edge variables in the same cluster are generally rounded iteration by iteration. In this way, the number of iterations is reduced in rounding self-mirrored-abutted edge variables.

For example, consider a case involving self-mirrored-abutted edge variables E1, E2, E3, E4 and E5 with the following equal constraints:

$$T1+E1=T2-E1$$

$$T1+E2=T2-E2$$

$$T3+E3=T4-E3$$

$$T4+E4=T5-E4$$

$$T5+E5=T6-E5$$

If self-mirrored-abutted edge variables interact with the same transformation variable (T1, T2, T3, T4 and T5), they belong to the same cluster. Accordingly, the following clusters are formed, one cluster contains E1 and E2, the other cluster contains E3, E4 and E5, which are denoted as {E1,E2} and {E3,E4,E5}. During the iteration, a variable from each cluster can be rounded, thus reducing the number of total iterations required.

Figure 12:
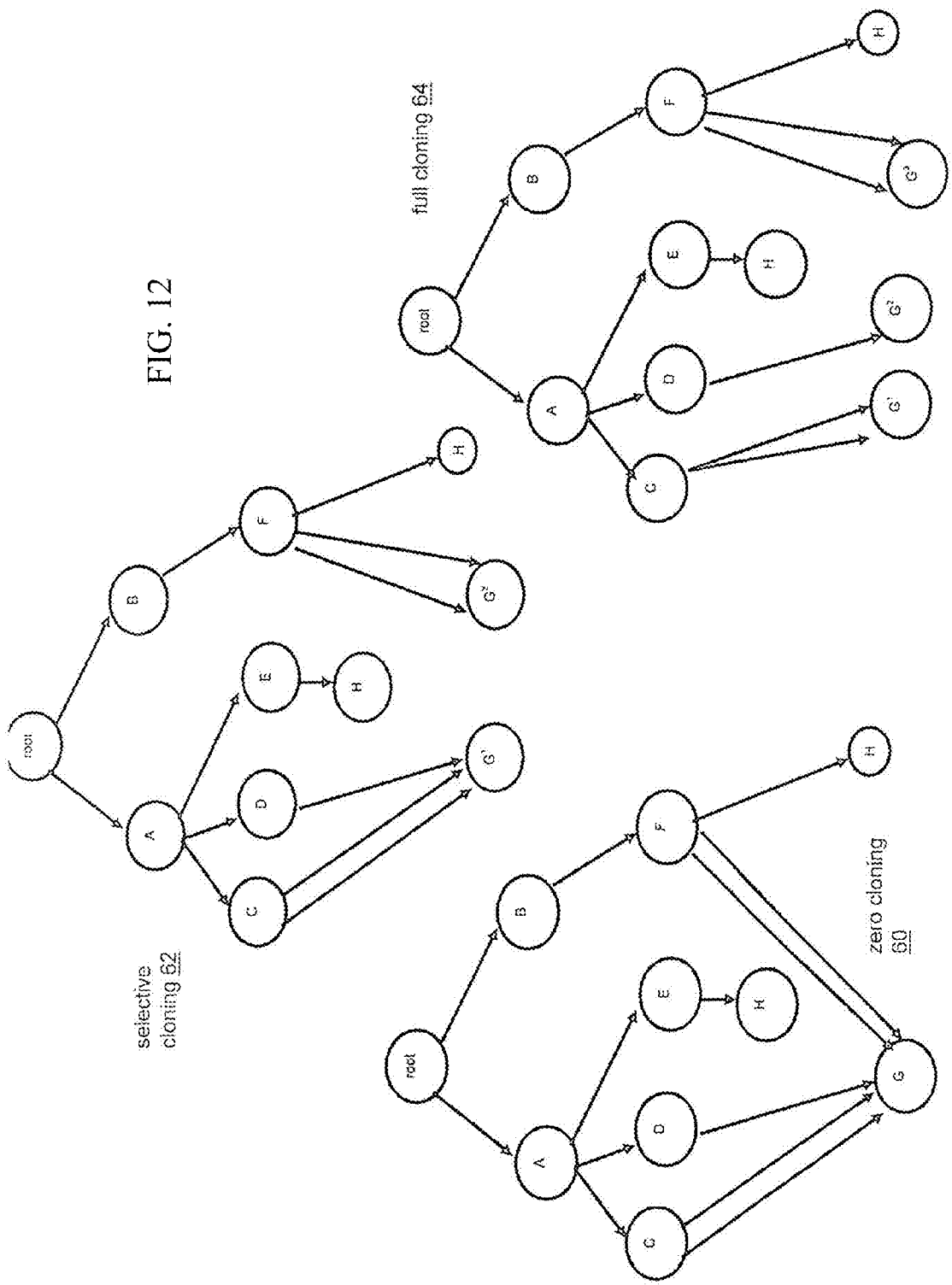
FIG. 12 shows three cloning options in accordance with an embodiment of the invention.

Hierarchy graph HG is preprocessed for clustering transformation variables with consideration of optional cloning the leaf nodes in process 47. Leaf nodes within the hierarchy graph for clustering may be handled differently, as shown in the three hierarchy graphs of FIG. 12. For a leaf-node G with k (k>1) parent-nodes (C, D, F) in the hierarchy graph, possible options to handle the leaf-node include:
(1) Zero cloning 60: keep one unique copy G in the graph;
(2) Selective cloning 62: based on the transformation variables' relationship in the constraints, selectively clone the leaf-nodes, $G^1$ and $G^2$; and
(3) Full cloning 64: clone k copies of the leaf-node $G^1$, $G^2$ and $G^3$. Full cloning will generally result in the maximal numbers of sub-trees/clusters, but with the highest amount of quality loss.

Selective cloning of leaf nodes may be implemented in the following fashion.
  Given two transformation variables, T1 and T2, corresponding to a leaf node:
  (1) Collect two constraint sets, S1 and S2, such that S1 includes all the constraints involving with T1, i.e., T1 appears in the constraint; and S2 includes all the constraints involving with T2;
  (2) check if there exists a common transformation variable that appears in both S1 and S2;
  (3) If there exists a common transformation variable, then T1 and T2 are related, and cannot be cloned. This defines a 1st degree relationship.

Note that 2nd degree relationships can likewise be identified for cloning purposes in the following manner. First, a relationship graph is built in which each node is a transformation variable and an arc is added between two nodes if the nodes are 1st degree related. If 2 nodes are at most two arcs away, then the two nodes are 2nd degree related.

Furthermore, if two nodes are at most n arcs away, then the two nodes are nth degree related. Accordingly, any degree relationships can be checked for cloning purposes.

Figure 13:
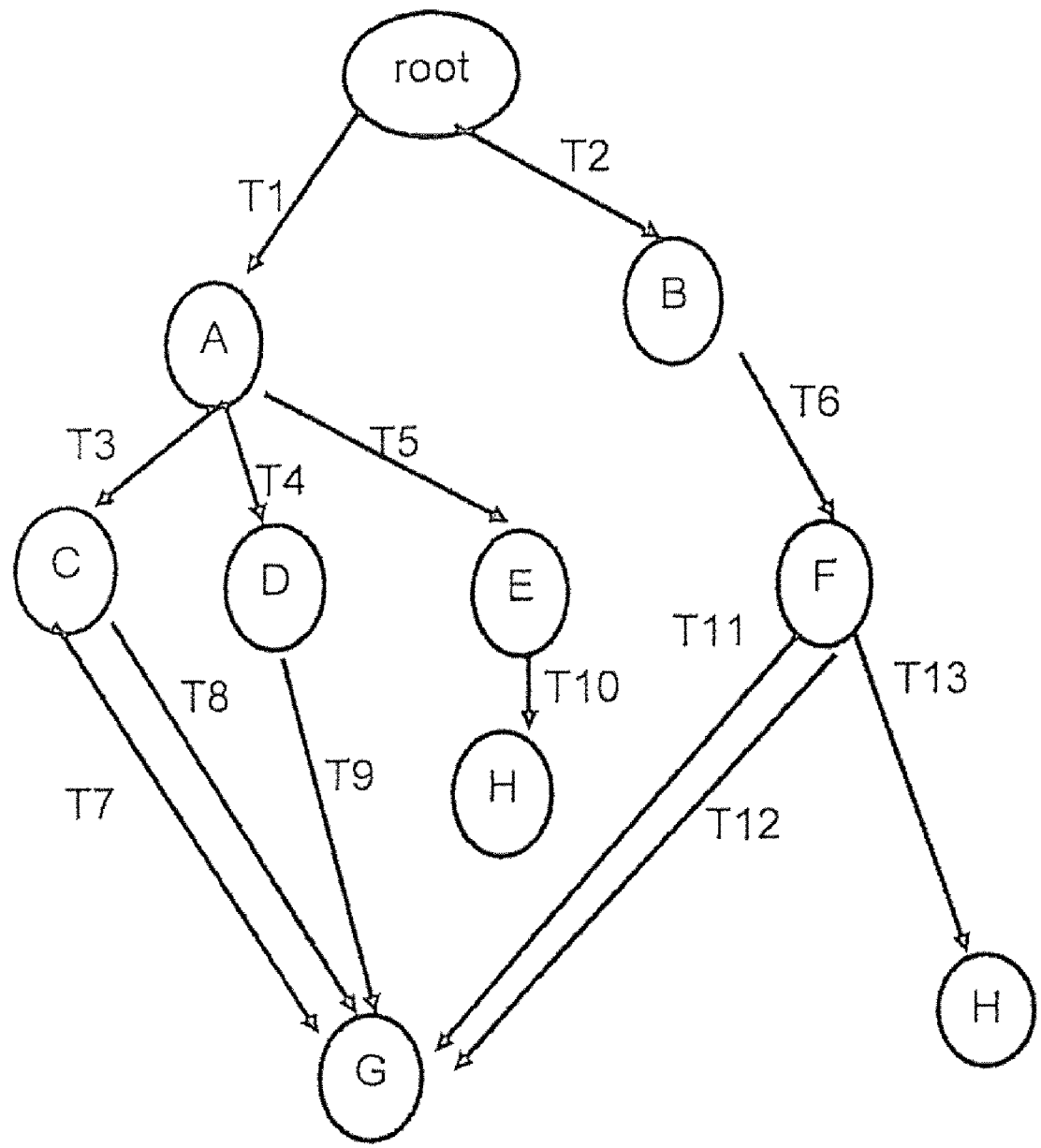
FIGS. 13-17 show the rounding process for the transformation variables for implementing selective cloning in accordance with an embodiment of the invention.
Figure 15:
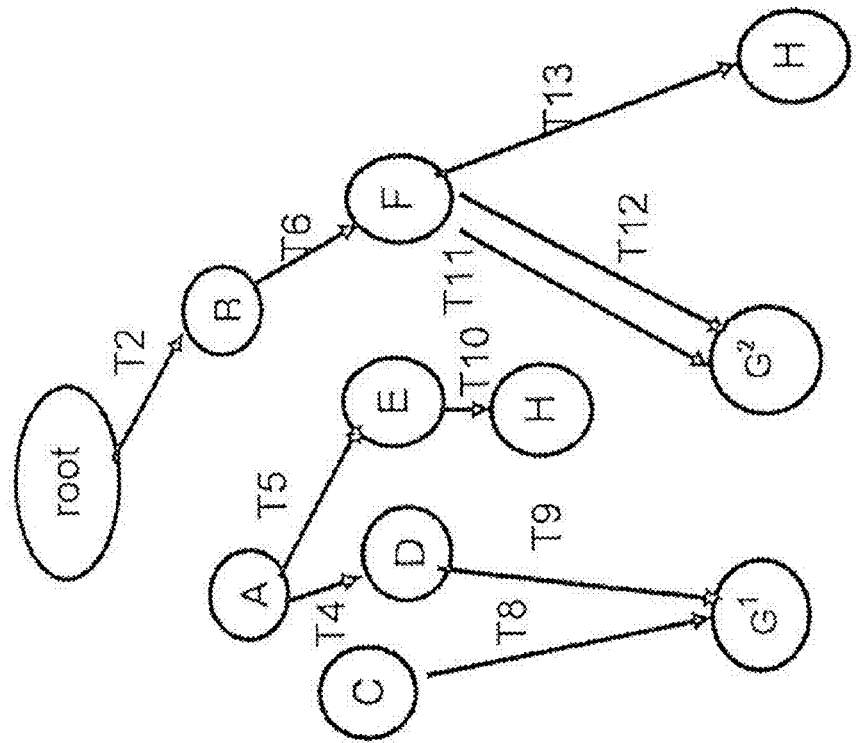
Figure 14:
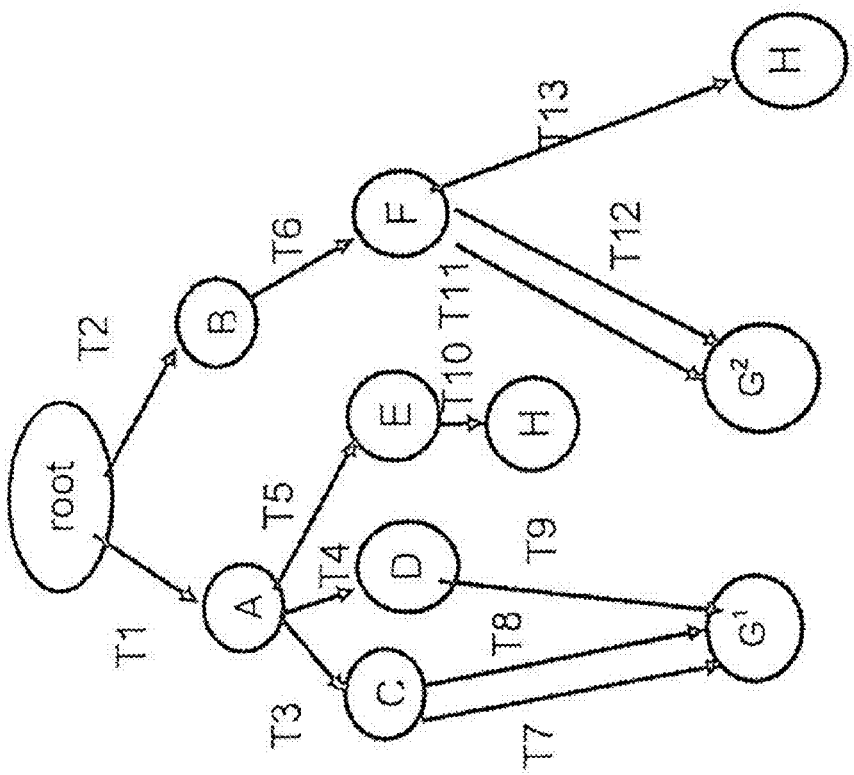

FIGS. 13-14 depict an illustration of the selective cloning. Beginning with the graph shown in FIG. 13, it can be seen that each arc is labeled with a transformation variable (T1-T13) and leaf-node G has three parent-nodes (C, D, F). First, the 1st degree relationship between {T7,T8}, {T9}, {T11, T12} are checked to see if any of the two sets of transformation variables are related, i.e., share the same transformation variable among the involved constraints. If so, then node G cannot be cloned for their corresponding parent nodes. T8 and T9 are related, so G cannot be cloned for C and D, but {T11,T12} are not related with {T7,T8}, {T9}, so node G can be cloned for node F, as shown in FIG. 14.

Figure 19:
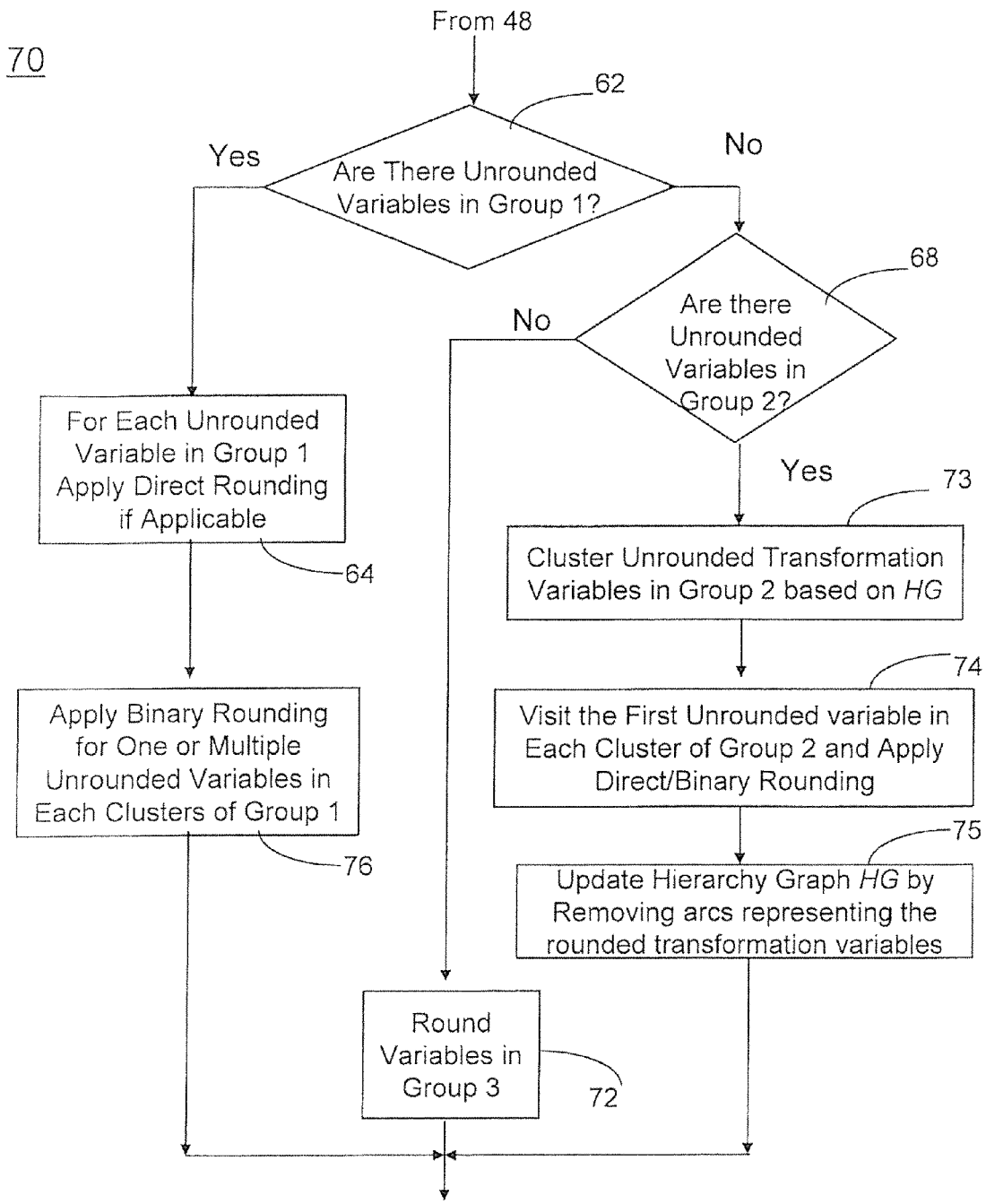
FIG. 19 shows a flow chart showing the improved methods for the iterative process in accordance with an embodiment of the invention.

FIG. 19 shows a flow chart 70 describing the rounding operation shown in FIG. 11. In particular, FIG. 19 shows how the rounding strategy described above is implemented to perform the rounding of variables to integers using the clustering approach. The flow chart 70 begins by receiving the LP solution from operation 48 of FIG. 11. First, it is determined at 62 whether there are any unrounded variables that exist in Group 1. If there are variables that exist in Group 1, then direct rounding is applied at 64 if applicable. For the rest of the variables, binary rounding is applied to each cluster of Group 1 at 76.

If it is determined at 62 that none of the unrounded variables exist in Group 1, then it is determined at 68 whether the unrounded variables exist in Group 2. If there are unrounded variables that exist in Group 2, clustering is performed on the unrounded transformation variables in process 73. The first unrounded variable in each cluster of Group 2 is visited and rounded at 74 by applying direct/binary rounding. Hierarchy graph HG is updated by removing arcs representing the rounded transformation variables in process 75. On the other hand, if there are no variables that exist in Group 2 as determined at 68, then known techniques as described above are used to round variables in Group 3 at 72. As described above for FIG. 10, after performing the rounding operation, a decision is then made to determine if all variables have been rounded to an integer.

Transformation variables are clustered at 73 based on the hierarchy graph representation of those unrounded transformation variables. Given the hierarch graph, if a transformation variable is rounded, the corresponding arc is removed. Thus, the graph will be broken into a forest, i.e., several sub-trees, and each sub-tree naturally forms a "cluster." At process 74, during each iteration, at least one transformation variable is rounded from each cluster. For transformation variables in the same cluster, the DFS-left-to-right order scheme is followed.

Figure 17:
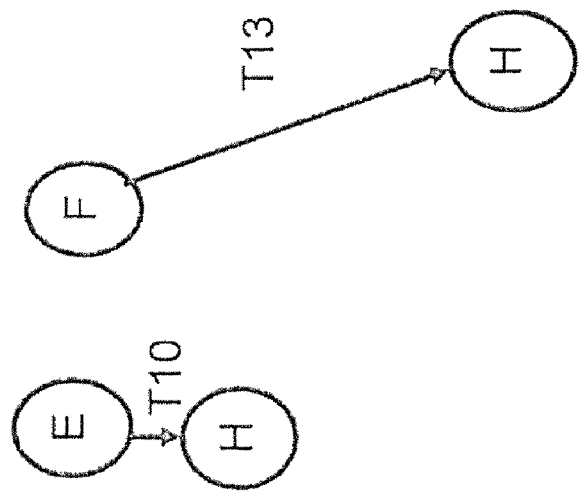
Figure 16:
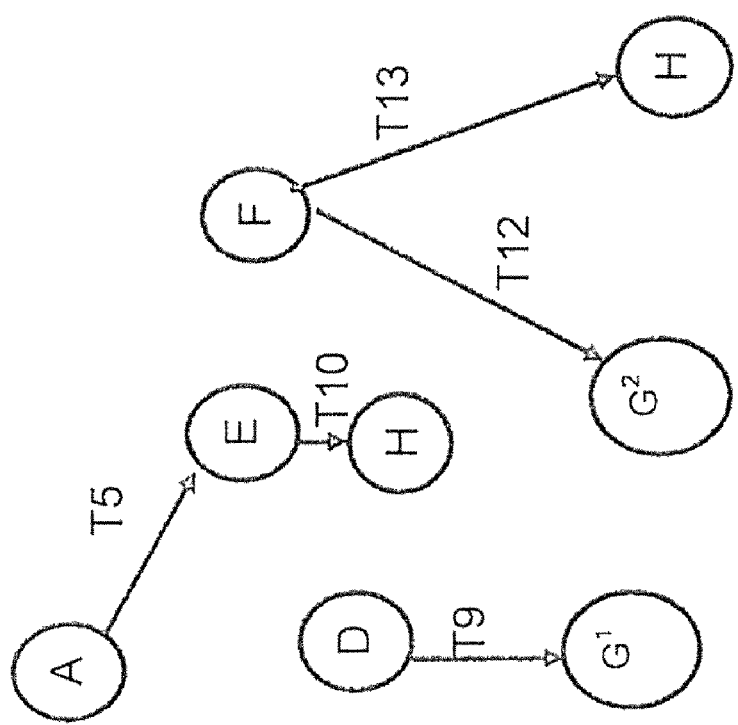

An example is shown in FIG. 14-17. Assume that T1, T3 and T7 in FIG. 14 are rounded during the first iteration when the transformation variables are rounded. These arcs would therefore be removed resulting in the two sub-trees shown in FIG. 15. Assume that during the second iteration, {T8, T4}, {T2, T6, T11} are rounded, and the corresponding arcs in the hierarchy graph HG are removed, resulting in the three sub-trees shown in FIG. 16. During the third iteration, {T9}, {T5}, {T12} are rounded, and two sub-trees are remaining as shown in FIG. 17. During the fourth iteration, {T10}, {T13} are rounded, and the process is done.

The foregoing flow charts of FIGS. 5, 10, 11 and 19 show some of the processing functions associated with the IRLS algorithm. In this regard, each block represents a process act associated with performing these functions. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe the processing functions may be added.

The operations described above can be implemented in an entirely hardware embodiment, an entirely software embodiment or an embodiment containing both hardware and software elements. In one embodiment, the process operations are performed on a general-purpose computer and are implemented in software, which includes but is not limited to firmware, resident software, microcode, etc.

In another embodiment, the process operations can take the form of a computer program product accessible from a computer-usable or computer readable storage medium providing program code for use by or in connection with a computer or any instruction execution system. For the purposes of this description, a computer-usable or computer readable storage medium can be any apparatus that can contain or store the program for use by or in connection with the computer, instruction execution system, apparatus, or device. The computer readable storage medium can be an electronic, magnetic, optical, electromagnetic, infrared, or semiconductor system (or apparatus or device). Examples of a computer readable storage medium include a semiconductor or solid state memory, magnetic tape, a removable computer diskette, a random access memory (RAM), a read-only memory (ROM), a rigid magnetic disk and an optical disk. Current examples of optical disks include a compact disk-read only memory (CD-ROM), a compact disk-read/write (CD-R/W) and a digital video disc (DVD).

Figure 20:
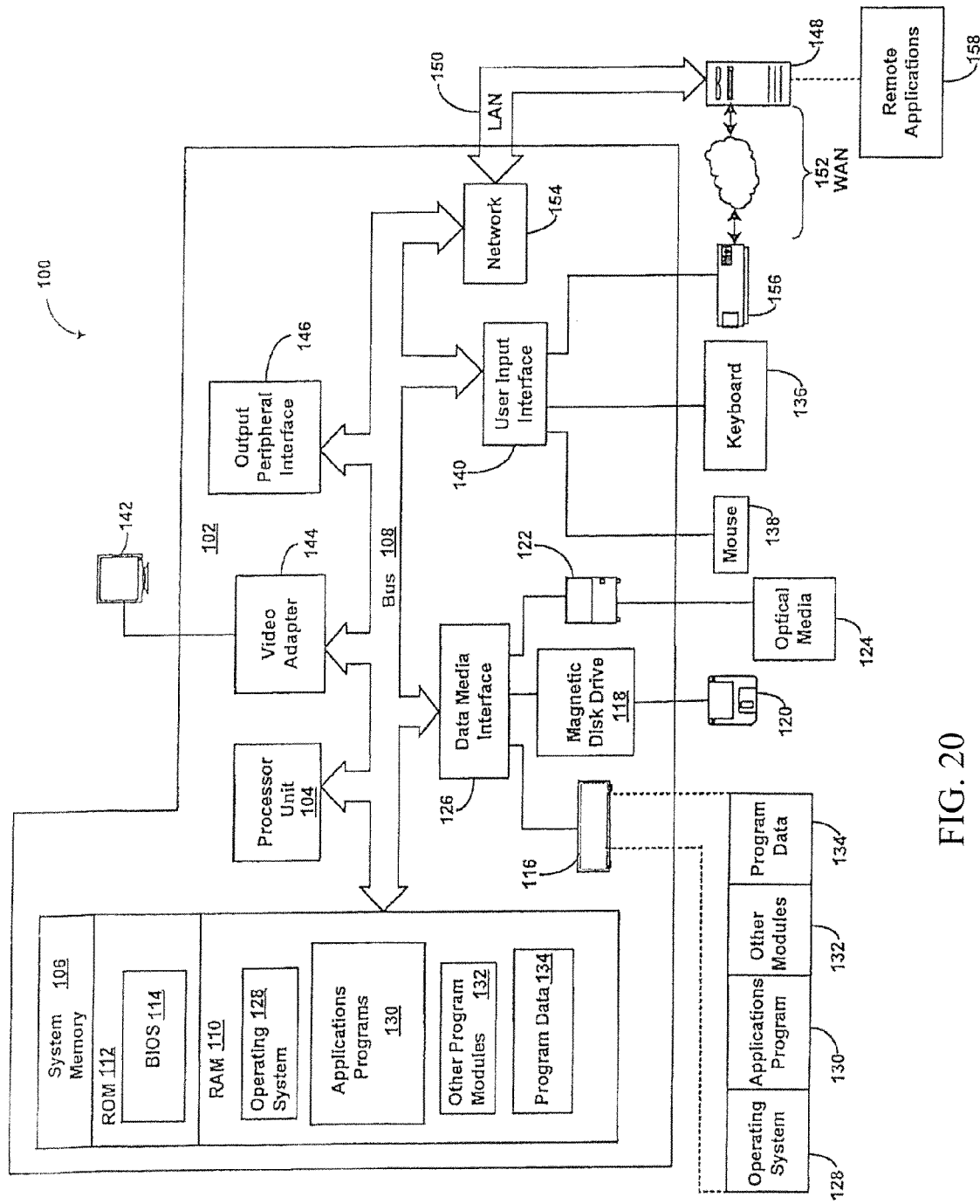
FIG. 20 shows a schematic of an illustrative computing environment in which embodiments of this disclosure may operate.

FIG. 20 shows a schematic of an exemplary computing environment which may perform the operations described with reference to FIGS. 5, 10, 11 and 19. The exemplary computing environment 100 is only one example of a suitable computing environment and is not intended to suggest any limitation as to the scope of use or functionality of the approach described herein. Neither should the computing environment 100 be interpreted as having any dependency or requirement relating to any one or combination of components illustrated in FIG. 20.

In the computing environment 100 there is a computer 102 which is operational with numerous other general purpose or special purpose computing system environments or configurations. As shown in FIG. 20, the computer 102 in the computing environment 100 is shown in the form of a general-purpose computing device. The components of computer 102 may include, but are not limited to, one or more processors or processing units 104, a system memory 106, and a bus 108 that couples various system components including the system memory 106 to the processor 104.

In FIG. 20, the system memory 106 includes computer readable media in the form of volatile memory, such as random access memory (RAM) 110, and/or non-volatile memory, such as ROM 112. A BIOS 114 containing the basic routines that help to transfer information between elements within computer 102, such as during start-up, is stored in ROM 112. RAM 110 typically contains data and/or program modules that are immediately accessible to and/or presently operated on by processor 104.

Computer 102 may further include other removable/non-removable, volatile/non-volatile computer storage media. By way of example only, FIG. 20 illustrates a hard disk drive 116 for reading from and writing to a non-removable, non-volatile magnetic media (not shown and typically called a "hard drive"), a magnetic disk drive 118 for reading from and writing to a removable, non-volatile magnetic disk 120 (e.g., a "floppy disk"), and an optical disk drive 122 for reading from or writing to a removable, non-volatile optical disk 124 such as a CD-ROM, DVD-ROM or other optical media. The hard disk drive 116, magnetic disk drive 118, and optical disk drive 122 are each connected to bus 108 by one or more data media interfaces 126.

The drives and their associated computer-readable media provide nonvolatile storage of computer readable instructions, data structures, program modules, and other data for computer 102. Although the exemplary environment described herein employs a hard disk 116, a removable magnetic disk 118 and a removable optical disk 122, it should be appreciated by those skilled in the art that other types of computer readable media which can store data that is accessible by a computer, such as magnetic cassettes, flash memory cards, digital video disks, RAMs, ROM, and the like, may also be used in the exemplary operating environment.

A number of program modules may be stored on the hard disk 116, magnetic disk 120, optical disk 122, ROM 112, or RAM 110, including, by way of example, and not limitation, an operating system 128, one or more application programs 130, other program modules 132, and program data 134. Each of the operating system 128, one or more application programs 130 other program modules 132, and program data 134 or some combination thereof, may include an implementation of the IRLS algorithm.

A user may enter commands and information into computer 102 through optional input devices such as a keyboard 136 and a pointing device 138 (such as a "mouse"). These and other input devices are connected to the processor unit 104 through a user input interface 140 that is coupled to bus 108, but may be connected by other interface and bus structures, such as a parallel port, game port, or a universal serial bus (USB).

An optional monitor 142 or other type of display device is also connected to bus 108 via an interface, such as a video adapter 144. In addition to the monitor, personal computers typically include other peripheral output devices (not shown), such as speakers and printers, which may be connected through output peripheral interface 146.

Computer 102 may operate in a networked environment using logical connections to one or more remote computers, such as a remote server/computer 148. Remote computer 148 may include many or all of the elements and features described herein relative to computer 102.

Logical connections shown in FIG. 20 are a local area network (LAN) 150 and a general wide area network (WAN) 152. Such networking environments are commonplace in offices, enterprise-wide computer networks, intranets, and the Internet. When used in a LAN networking environment, the computer 102 is connected to LAN 150 via network interface or adapter 154. When used in a WAN networking environment, the computer typically includes a modem 156 or other means for establishing communications over the WAN 152. The modem, which may be internal or external, may be connected to the system bus 108 via the user input interface 140 or other appropriate mechanism.

In a networked environment, program modules depicted relative to the personal computer 102, or portions thereof, may be stored in a remote memory storage device. By way of example, and not limitation, FIG. 20 illustrates remote application programs 158 as residing on a memory device of remote computer 148.

It is apparent that there has been provided with this disclosure an approach for obtaining a feasible integer solution in a hierarchical circuit layout optimization. While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A method for obtaining a feasible integer solution in a hierarchical circuit layout optimization, comprising:
receiving, using a computer device, a hierarchical circuit layout and ground rule files;
representing, using the computer device, constraints in the hierarchical circuit layout as an original integer linear programming problem;
deriving, using the computer device, a relaxed linear programming problem from the original integer linear programming problem by relaxing integer constraints and using relaxation variables on infeasible constraints;
partitioning the relaxation variables into three groups including a first group of relaxation variables, a second group of relaxation variables, and a third group of relaxation variables, wherein the first group of relaxation variables comprises any self-mirrored-abutted edge variable, the second group of relaxation variables comprises any transformation variable, and the third group of relaxation variables comprises any edge variable that is not a self-mirrored-abutted edge variable;
solving, using the computer device, the relaxed linear programming problem to obtain a linear programming solution;
rounding, using the computer device, at least one relaxation variable in each of the three groups to an integer value according to the linear programming solution using a clustering approach, wherein the relaxation variables of each of the three groups are rounded in an order unique to each of the three groups;
iterating, using the computer device, unrounded variables back through the deriving, solving, and rounding processes until all unrounded variables are rounded to integer values; and
generating, using the computer device, a modified hierarchical circuit layout in response to a determination that all the variables are rounded to integer values.

2. The method of claim 1, wherein in response to determining there exist no unrounded variables in the first group, clustering unrounded transformation variables in a second group in response to determining the existence of unrounded variables in the second group.

3. The method according to claim 2, further comprising:
applying direct or binary rounding to a first unrounded variable in each cluster of the second group; and
updating a modeling hierarchy that is representative of the hierarchical circuit layout by removing arcs representing rounded transformation variables.

4. The method according to claim 2, wherein clustering unrounded transformation variables includes cloning leaf nodes in a modeling hierarchy that is representative of the hierarchical circuit layout.

5. The method according to claim 4, wherein cloning leaf nodes includes full cloning or selective cloning.

6. A computer-readable storage medium storing computer instructions, which when executed, enables a computer system to obtain a feasible integer solution in a hierarchical circuit layout optimization, the computer instructions comprising:
program code for receiving a hierarchical circuit layout and ground rule files;
program code for representing constraints in the hierarchical circuit layout as an original integer linear programming problem;
program code for deriving a relaxed linear programming problem from the original integer linear programming problem by relaxing integer constraints and using relaxation variables on infeasible constraints;
program coded for partitioning the relaxation variables into three groups including a first group of relaxation variables, a second group of relaxation variables, and a third group of relaxation variables, wherein the first group of relaxation variables comprises any self-mirrored-abutted edge variable, the second group of relaxation variables comprises any transformation variable, and the third group of relaxation variables comprises any edge variable that is not a self-mirrored-abutted edge variable;
program code for solving the relaxed linear programming problem to obtain a linear programming solution;
program code for rounding at least one relaxation variable in each of the three groups to an integer value according to the linear programming solution using a clustering approach, wherein the relaxation variables of each of the three groups are rounded in an order unique to each of the three groups;
program code for iterating unrounded variables back through the program code for deriving, solving, and rounding until all unrounded variables are rounded to integer values: and
program code for generating a modified hierarchical circuit layout in response to a determination that all the variables are rounded to integer values.

7. The computer-readable storage medium according to claim 6, wherein in response to determining there exist no unrounded variables in the first group, clustering unrounded transformation variables in a second group in response to determining the existence of unrounded variables in the second group.

8. The computer-readable storage medium according to claim 7, further comprising:
program code for applying direct or binary rounding to a first unrounded variable in each cluster of the second group; and
program code updating a modeling hierarchy that is representative of the hierarchical circuit layout by removing arcs representing rounded transformation variables.

9. The computer-readable storage medium according to claim 7, wherein clustering unrounded transformation variables includes cloning leaf nodes in a modeling hierarchy that is representative of the hierarchical circuit layout.

10. The computer-readable storage medium according to claim 9, wherein cloning leaf nodes includes full cloning or selective cloning.

11. A system for obtaining a feasible integer solution in a hierarchical circuit layout optimization, comprising:
at least one computer processor; and
at least one memory device operatively coupled to the at least one computer processor, the system comprising:
a module for receiving a hierarchical circuit layout and ground rule files;
a module for representing constraints in the hierarchical circuit layout as an original integer linear programming problem;
a module for deriving a relaxed linear programming problem from the original integer linear programming problem by relaxing integer constraints and using relaxation variables on infeasible constraints;
a module for partitioning the relaxation variables into three groups including a first group of relaxation variables, a second group of relaxation variables, and a third group of relaxation variables, wherein the first group of relaxation variables comprises any self-mirrored-abutted edge variable, the second group of relaxation variables comprises any transformation variable, and the third group of relaxation variables comprises any edge variable that is not a self-mirrored-abutted edge variable;

a module for solving the relaxed linear programming problem to obtain a linear programming solution;

a module for rounding at least one relaxation variable in each of the three groups to an integer value according to the linear programming solution using a clustering approach, wherein the relaxation variables of each of the three groups are rounded in an order unique to each of the three groups;

a module for iterating unrounded variables back through the deriving, solving, partitioning and rounding modules until all unrounded variables are rounded to integer values; and a module for generating a modified hierarchical circuit layout in response to a determination that all the variables are rounded to integer values.

12. The system according to claim 11, wherein in response to determining there exist no unrounded variables in the first group, clustering unrounded transformation variables in a second group in response to determining the existence of unrounded variables in the second group.

13. The system according to claim 12, further comprising:
a module for applying direct or binary rounding to a first unrounded variable in each cluster of the second group; and
a module for updating a modeling hierarchy that is representative of the hierarchical circuit layout by removing arcs representing rounded transformation variables.

14. The system according to claim 12, wherein clustering unrounded transformation variables includes cloning leaf nodes in a modeling hierarchy that is representative of the hierarchical circuit layout.

15. The system according to claim 14, wherein cloning leaf nodes includes full cloning or selective cloning.

* * * * *